(12) United States Patent
Lai

(10) Patent No.: US 12,089,500 B2
(45) Date of Patent: Sep. 10, 2024

(54) PIEZOELECTRIC HAPTIC STRUCTURE

(71) Applicant: Darwin Precisions Corporation, Hsinchu County (TW)

(72) Inventor: Yu-Jen Lai, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 166 days.

(21) Appl. No.: 17/718,824

(22) Filed: Apr. 12, 2022

(65) Prior Publication Data

US 2023/0165150 A1    May 25, 2023

(30) Foreign Application Priority Data

Nov. 19, 2021 (TW) .................................. 110143250

(51) Int. Cl.
*H10N 30/20* (2023.01)
*G06F 3/01* (2006.01)

(52) U.S. Cl.
CPC ......... *H10N 30/2047* (2023.02); *G06F 3/016* (2013.01)

(58) Field of Classification Search
CPC .... H10N 30/2047; G06F 3/016; G06F 3/0414
See application file for complete search history.

(56) References Cited

U.S. PATENT DOCUMENTS

| 6,278,790 | B1 * | 8/2001 | Davis | H04R 7/04 |
| | | | | 381/431 |
| 2010/0156844 | A1 * | 6/2010 | Paleczny | G06F 3/041 |
| | | | | 345/174 |
| 2015/0133221 | A1 * | 5/2015 | Danny | A63F 13/92 |
| | | | | 345/184 |
| 2019/0265793 | A1 | 8/2019 | Costante | |
| 2023/0007404 | A1 * | 1/2023 | Ko | B06B 1/0629 |

FOREIGN PATENT DOCUMENTS

| CN | 1727858 A | 2/2006 |
| KR | 101405123 B1 | 6/2014 |
| TW | I696757 B | 6/2020 |

OTHER PUBLICATIONS

Yu-Jen Lai "U.S. Appl. No. 17/534,471" filed on Nov. 24, 2021, USA.

* cited by examiner

*Primary Examiner* — David Tung
(74) *Attorney, Agent, or Firm* — WPAT, PC

(57) ABSTRACT

A piezoelectric haptic structure includes a thin film, a structural plate and a piezoelectric actuator. The thin film is stacked on the structural plate. The structural plate includes a plate body, a vibrating portion and an elastic portion. The plate body has an inner wall. The inner wall defines a space. The vibrating portion is located in the space and is away from the inner wall. The vibrating portion has an outer wall. The outer wall and the inner wall define a gap therebetween. The elastic portion is elastically connected between the outer wall and the inner wall. The elastic portion seals the gap. The piezoelectric actuator is sandwiched between the thin film and the vibrating portion.

4 Claims, 10 Drawing Sheets

PIEZOELECTRIC HAPTIC STRUCTURE

RELATED APPLICATIONS

This application claims priority to Taiwanese Application Serial Number 110143250 filed Nov. 19, 2021, which is herein incorporated by reference.

BACKGROUND

Technical Field

The present disclosure relates to piezoelectric haptic structures. More particularly, the present disclosure relates to piezoelectric haptic structures applied to in-mold electronics (IME).

Description of Related Art

With the continuous improvement of the living standards nowadays, application of electronic products has become an indispensable part of life. Among different choices, the electronic products with touch function have become more and more popular. Correspondingly, with the rapid advancement of technology, the demand and expectation of people to the electronic products has also been increasing.

For example, in order to allow users to have a deeper experience when touching electronic products, the technology of interaction between human and computer of haptic feedback has also become more and more popular. Through the technology of haptic feedback, users can have a more precise and clear interaction when using electronic products.

SUMMARY

A technical aspect of the present disclosure is to provide a piezoelectric haptic structure, which can achieve a good effect of haptic feedback.

According to an embodiment of the present disclosure, a piezoelectric haptic structure includes a thin film, a structural plate and a piezoelectric actuator. The thin film is stacked on the structural plate. The structural plate includes a plate body, a vibrating portion and an elastic portion. The plate body has an inner wall. The inner wall defines a space. The vibrating portion is located in the space and is away from the inner wall. The vibrating portion has an outer wall. The outer wall and the inner wall define a gap therebetween. The elastic portion is elastically connected between the outer wall and the inner wall. The elastic portion seals the gap. The piezoelectric actuator is sandwiched between the thin film and the vibrating portion.

In one or more embodiments of the present disclosure, the elastic portion completely surrounds the vibrating portion.

In one or more embodiments of the present disclosure, the elastic portion abuts against the thin film.

In one or more embodiments of the present disclosure, the vibrating portion has a first thickness. The plate body has a second thickness. The elastic portion has a third thickness. The third thickness is less than the first thickness and the second thickness.

In one or more embodiments of the present disclosure, the outer wall and the inner wall are separated from each other by at least one distance. The elastic portion has a length extending between the outer wall and the inner wall. The length is equal to the distance.

In one or more embodiments of the present disclosure, the outer wall and the inner wall are separated from each other by a distance. The elastic portion has a length extending between the outer wall and the inner wall. The length is larger than the distance.

In one or more embodiments of the present disclosure, the elastic portion has at least one curved part located between the outer wall and the inner wall.

In one or more embodiments of the present disclosure, a first material of the elastic portion is the same as a second material of the plate body and the vibrating portion.

In one or more embodiments of the present disclosure, a first material of the elastic portion is different from a second material of the plate body and the vibrating portion.

In one or more embodiments of the present disclosure, the piezoelectric haptic structure further includes a plastic frame. The plastic frame is disposed on a side of the thin film facing to the elastic portion. The plastic frame at least partially surrounds the piezoelectric actuator.

The above-mentioned embodiments of the present disclosure have at least the following advantages:

(1) Since the position of the vibrating portion corresponds to the pressing zone on the thin film, and the elastic portion is elastically connected between the outer wall of the vibrating portion and the inner wall of the plate body, when the piezoelectric actuator vibrates, the elastic portion carries out reciprocally elastic deformations with regard to the vibration of the piezoelectric actuator. Thus, the vibrating portion can significantly vibrate relative to the plate body, such that the user can clearly feel vibration of the vibrating portion together with the piezoelectric actuator and know that the pressing on the pressing zone is properly completed. In this way, the piezoelectric haptic structure can achieve a good effect of haptic feedback.

(2) Since the structure of the piezoelectric haptic structure is simple, and the quantity of the components involved is small, the manufacturing time and the production cost of the piezoelectric haptic structure can be effectively reduced.

(3) Since the elastic portion of the structural plate can have at least one curved part located between the outer wall and the inner wall, the buffering effect of the vibration of the vibrating portion and the thin film relative to the plate body is enhanced.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
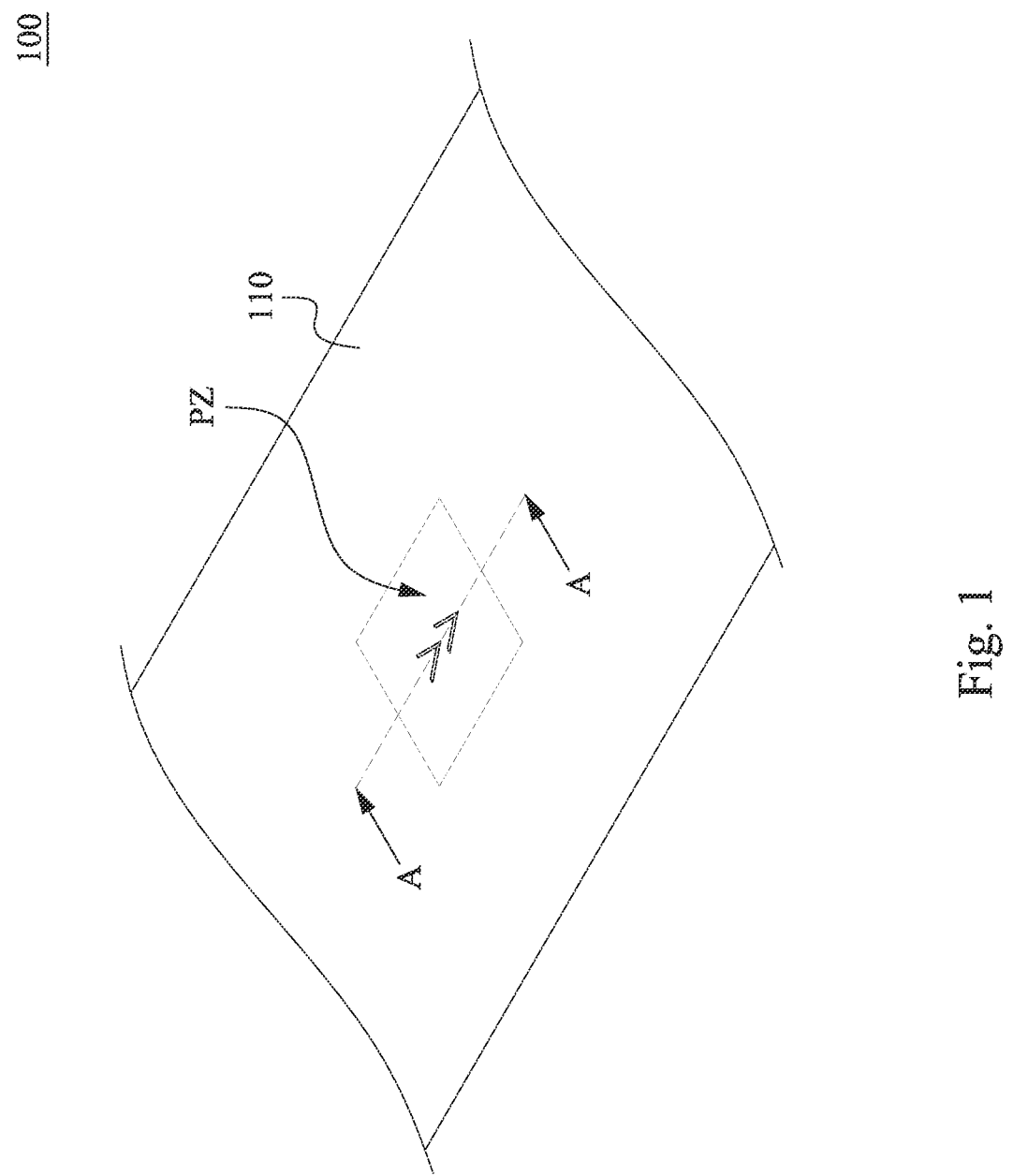
FIG. 1 is a schematic top view of a piezoelectric haptic structure according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
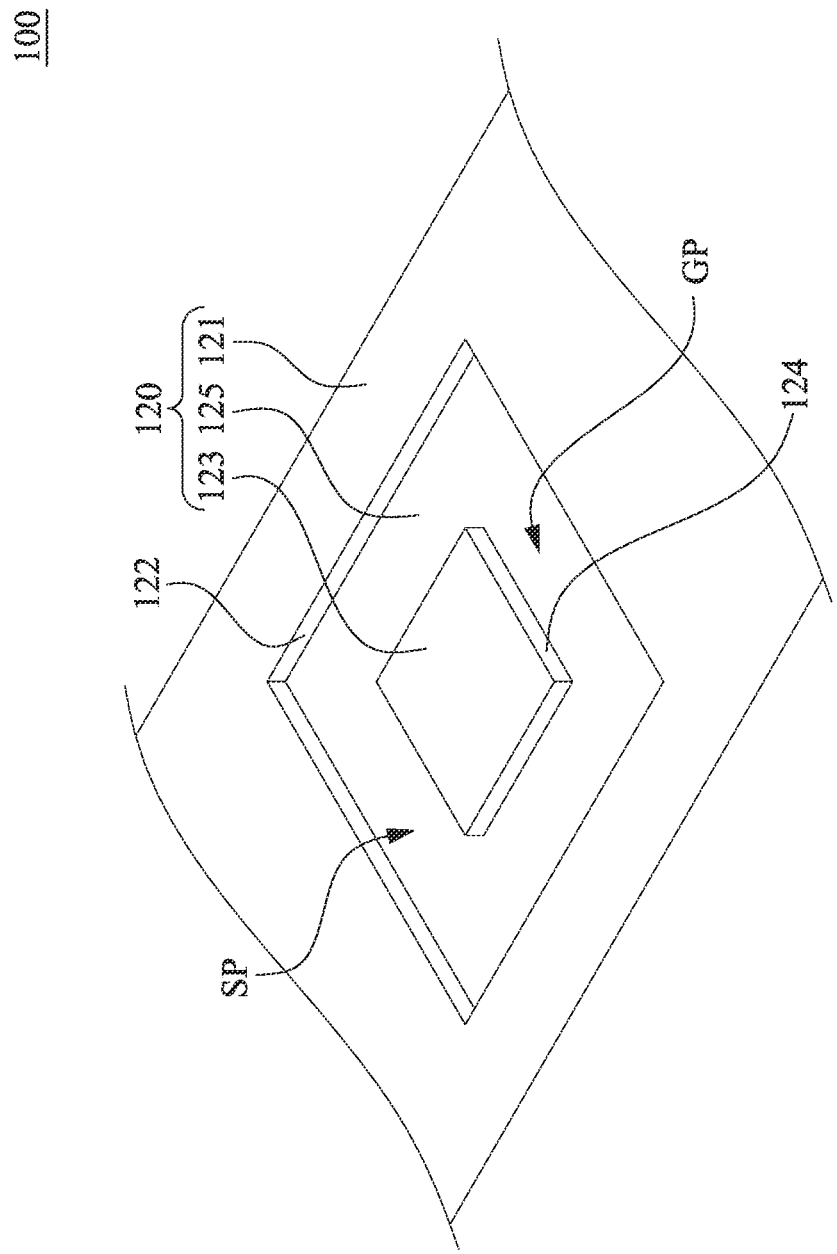
FIG. 2 is a schematic bottom view of the piezoelectric haptic structure of FIG. 1.
Figure 3:
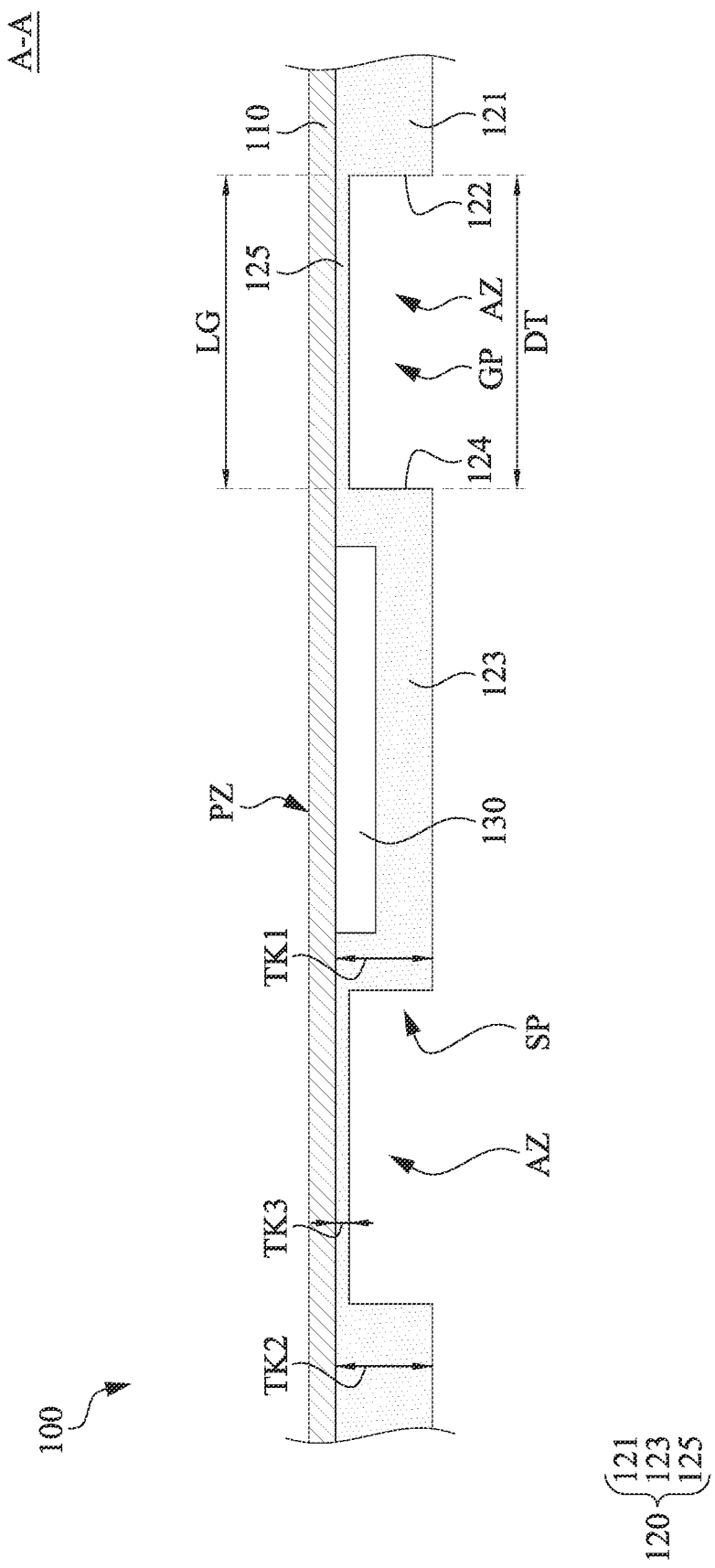
FIG. 3 is a cross-sectional view along the sectional line A-A of FIG. 1.

Reference is made to FIGS. 1-3. FIG. 1 is a schematic top view of a piezoelectric haptic structure 100 according to an embodiment of the present disclosure. FIG. 2 is a schematic bottom view of the piezoelectric haptic structure 100 of FIG. 1. FIG. 3 is a cross-sectional view along the sectional line A-A of FIG. 1. In this embodiment, as shown in FIGS. 1-3, a piezoelectric haptic structure 100 includes a thin film 110, a structural plate 120 and a piezoelectric actuator 130. The thin film 110 is stacked on the structural plate 120. The thin film 110 defines a pressing zone PZ for a user to press thereon. The structural plate 120 includes a plate body 121, a vibrating portion 123 and an elastic portion 125. The plate body 121 has an inner wall 122. The inner wall 122 surrounds and defines a space SP. The vibrating portion 123 is located in the space SP and is away from the inner wall 122. This means the vibrating portion 123 does not directly contact with the plate body 121. A position of the vibrating portion 123 corresponds to the pressing zone PZ on the thin film 110. The vibrating portion 123 of the structural plate 120 has an outer wall 124. The outer wall 124 of the vibrating portion 123 and the inner wall 122 of the plate body 121 define a gap GP therebetween. The elastic portion 125 is elastically connected between the outer wall 124 and the inner wall 122. The elastic portion 125 seals the gap GP. To be specific, the piezoelectric actuator 130 is sandwiched between the thin film 110 and the vibrating portion 123. In practical applications, the piezoelectric haptic structure 100 is applied to in-mold electronics (IME) (not shown). For example, the piezoelectric haptic structure 100 can be a part of an in-mold electronic, and the thin film 110 is a surface of the in-mold electronic. For the sake of drawing simplification, the cables/electrodes connected to the piezoelectric actuator 130 are not shown in FIGS. 1-3 and other figures as described below.

When a user presses on the pressing zone PZ on the thin film 110, the piezoelectric actuator 130 is actuated, and the piezoelectric actuator 130 converts the input electric energy into mechanical kinetic energy. For example, the piezoelectric actuator 130 generates vibration after being actuated. As mentioned above, since the position of the vibrating portion 123 corresponds to the pressing zone PZ on the thin film 110, and the piezoelectric actuator 130 is sandwiched between the thin film 110 and the vibrating portion 123, the position of the piezoelectric actuator 130 also corresponds to the pressing zone PZ. In addition, since the elastic portion 125 is elastically connected between the outer wall 124 of the vibrating portion 123 and the inner wall 122 of the plate body 121, when the piezoelectric actuator 130 vibrates, the elastic portion 125 carries out reciprocally elastic deformations with regard to the vibration of the piezoelectric actuator 130. Thus, the vibrating portion 123 can significantly vibrate relative to the plate body 121 and the loss of kinetic energy of the vibrating portion 123 can be reduced, such that the user can clearly feel vibration of the vibrating portion 123 together with the piezoelectric actuator 130 and know that the pressing on the pressing zone PZ is properly completed. In this way, the piezoelectric haptic structure 100 can achieve a good effect of haptic feedback.

It is worth to note that, the structure of the piezoelectric haptic structure 100 is simple, and the quantity of the components involved is small. Thus, the manufacturing time and the production cost of the piezoelectric haptic structure 100 can be effectively reduced.

In addition, structurally speaking, as shown in FIG. 2, since the elastic portion 125 of the structural plate 120 completely surrounds the vibrating portion 123, the vibration of the vibrating portion 123 relative to the plate body 121 becomes stable. Thus, the piezoelectric haptic structure 100 can achieve a good effect of haptic feedback.

Moreover, as shown in FIG. 3, the elastic portion 125 of the structural plate 120 abuts against the thin film 110. Thus, the overall strength of the structural plate 120 and the thin film 110 is enhanced.

Furthermore, as shown in FIG. 3, the vibrating portion 123 of the structural plate 120 has a first thickness TK1. The plate body 121 of the structural plate 120 has a second thickness TK2. The elastic portion 125 of the structural plate 120 has a third thickness TK3. In this embodiment, the third thickness TK3 of the elastic portion 125 is less than the first thickness TK1 of the vibrating portion 123, and the third thickness TK3 of the elastic portion 125 is also less than the second thickness TK2 of the plate body 121. In practice, for example, the first thickness TK1 of the vibrating portion 123 can be within 0.5-5.0 mm. The second thickness TK2 of the plate body 121 can be larger than or equal to the first thickness TK1 of the vibrating portion 123. The third thickness TK3 of the elastic portion 125 can be within 0.0-2.0 mm. However, this does not intend to limit the present disclosure.

In practical applications, the structural plate 120 can be formed from injection molding. Therefore, the vibrating portion 123, the elastic portion 125 and the plate body 121 can be an integrally formed structure, and the material of the elastic portion 125 is the same as the material of the plate body 121 and the vibrating portion 123. For example, during the process of the injection molding, a user forms an avoiding zone AZ between the vibrating portion 123 and the plate body 121. The avoiding zone AZ is substantially the space SP within which formation of the plastic does not occur during the process of the injection molding. In this way, the elastic portion 125 with thickness less than the vibrating portion 123 and the plate body 121 can be formed between the vibrating portion 123 and the plate body 121.

According to the actual situations, the outer wall 124 of the vibrating portion 123 and the inner wall 122 of the plate body 121 can be surfaces parallel with each other or surfaces inclines with each other. However, this does not intend to limit the present disclosure. To be specific, as shown in FIG. 3, the outer wall 124 of the vibrating portion 123 and the inner wall 122 of the plate body 121 are separated from each other by a distance DT. The elastic portion 125 has a length LG extending between the outer wall 124 and the inner wall 122. In this embodiment, the length LG of the elastic portion 125 is equal to the distance DT separated between the outer wall 124 of the vibrating portion 123 and the inner wall 122 of the plate body 121. In other words, the elastic portion 125 is horizontally disposed relative to the vibrating portion 123 and the plate body 121 and elastically connected between the vibrating portion 123 and the plate body 121. To be specific, the distance DT separated between the outer wall 124 of the vibrating portion 123 and the inner wall 122 of the plate body 121 is equal to the width of the gap GP between the outer wall 124 of the vibrating portion 123 and the inner wall 122 of the plate body 121. In practice, for example, the distance DT can be larger than 0.5 mm. However, this does not intend to limit the present disclosure.

Figure 4:
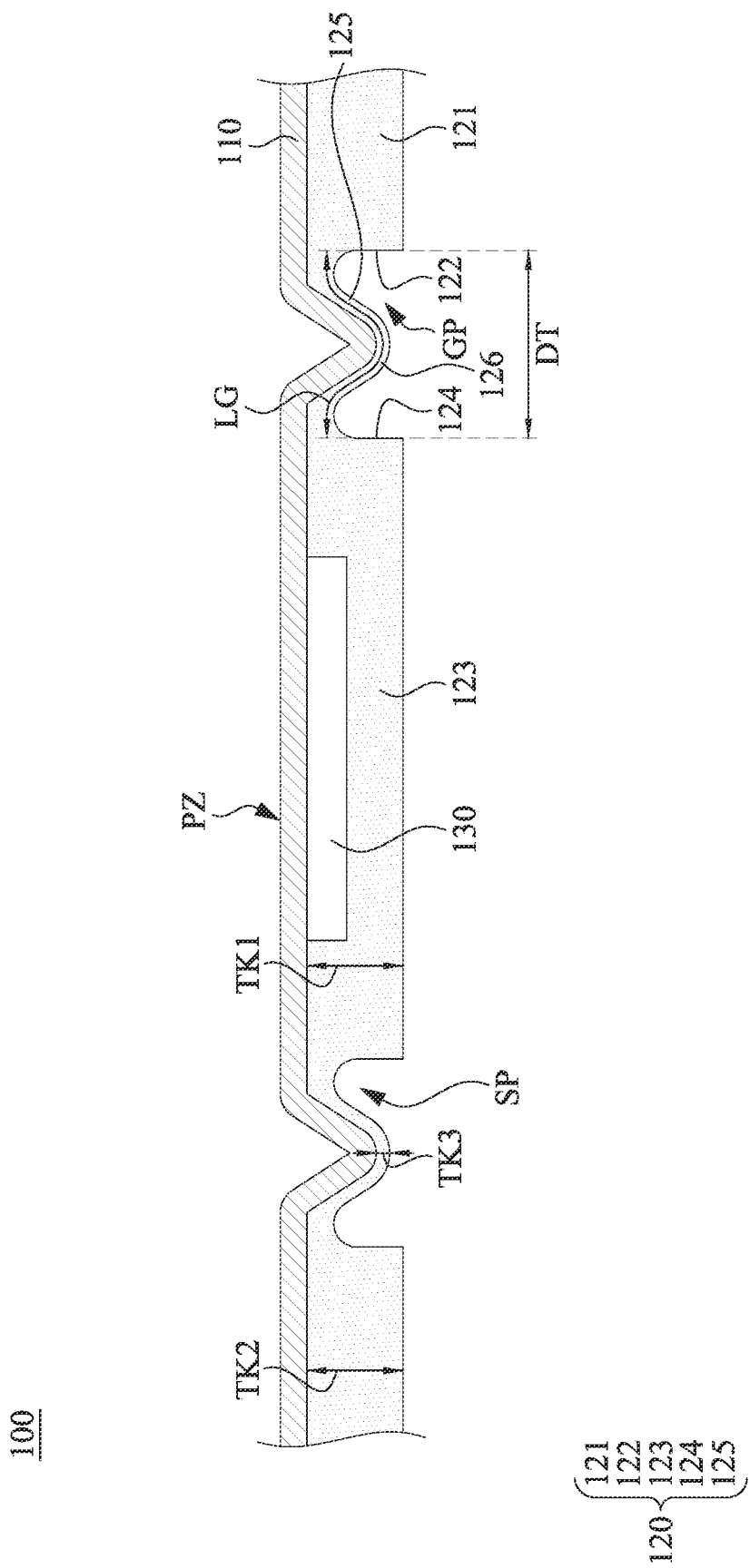
FIG. 4 is a cross-sectional view of a piezoelectric haptic structure according to another embodiment of the present disclosure.

Reference is made to FIG. 4. FIG. 4 is a cross-sectional view of a piezoelectric haptic structure 100 according to another embodiment of the present disclosure. In this embodiment, as shown in FIG. 4, according to different characteristics of the vibration of the vibrating portion 123 relative to the plate body 121, for example, for the sake of enhancement of a buffering effect of the vibration of the vibrating portion 123 and the thin film 110 relative to the plate body 121, the elastic portion 125 of the structural plate 120 has at least one curved part 126 located between the outer wall 124 and the inner wall 122. Therefore, the length LG of the elastic portion 125 extending between the outer wall 124 of the vibrating portion 123 and the inner wall 122 of the plate body 121 is larger than the distance DT separated between the outer wall 124 and the inner wall 122. Moreover, as shown in FIG. 4, the portion of the thin film 110 connecting with the curved part 126 is also curved or bent with the curved part 126.

Figure 5:
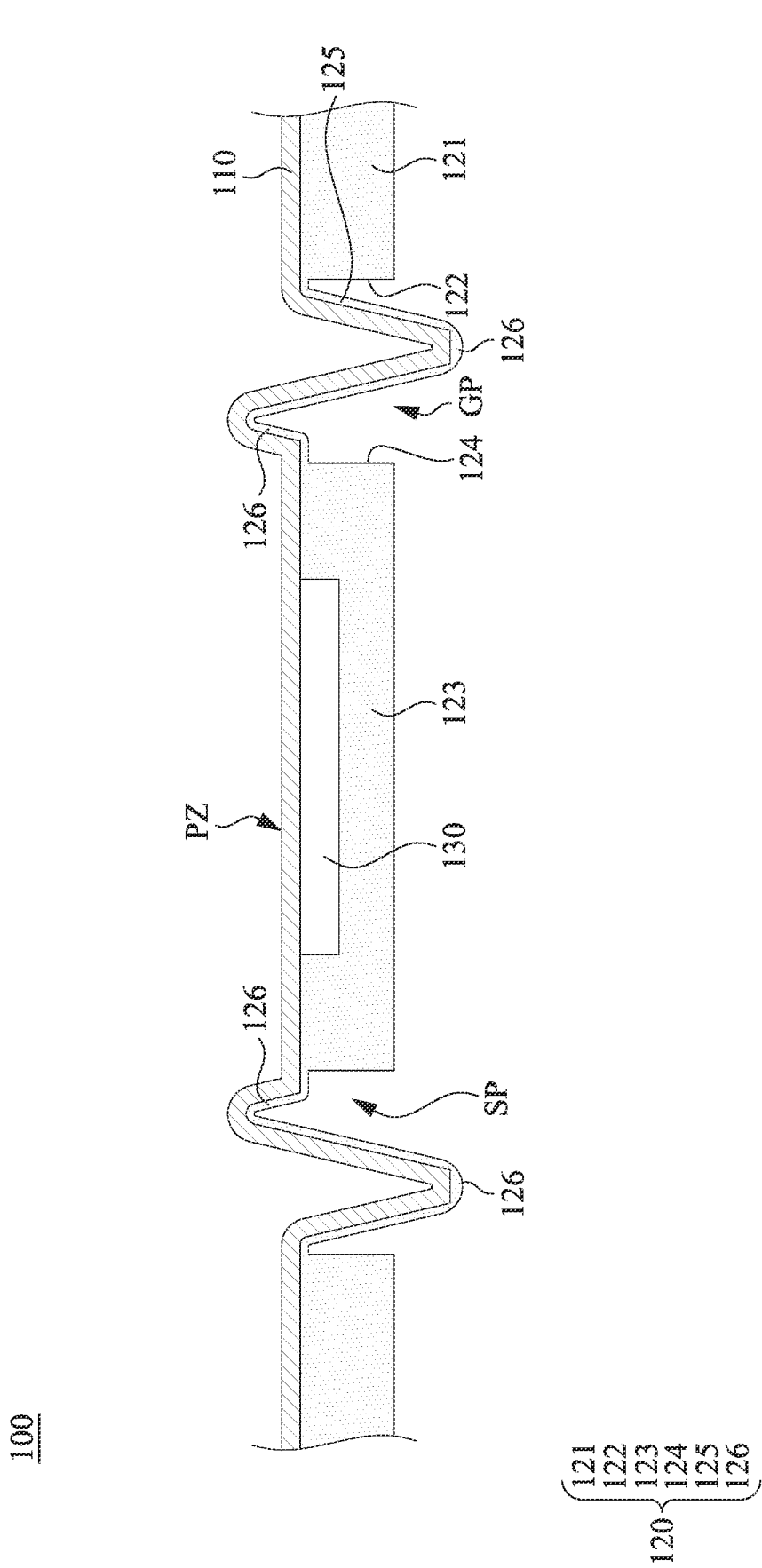
FIG. 5 is a cross-sectional view of a piezoelectric haptic structure according to a further embodiment of the present disclosure.
Figure 6:
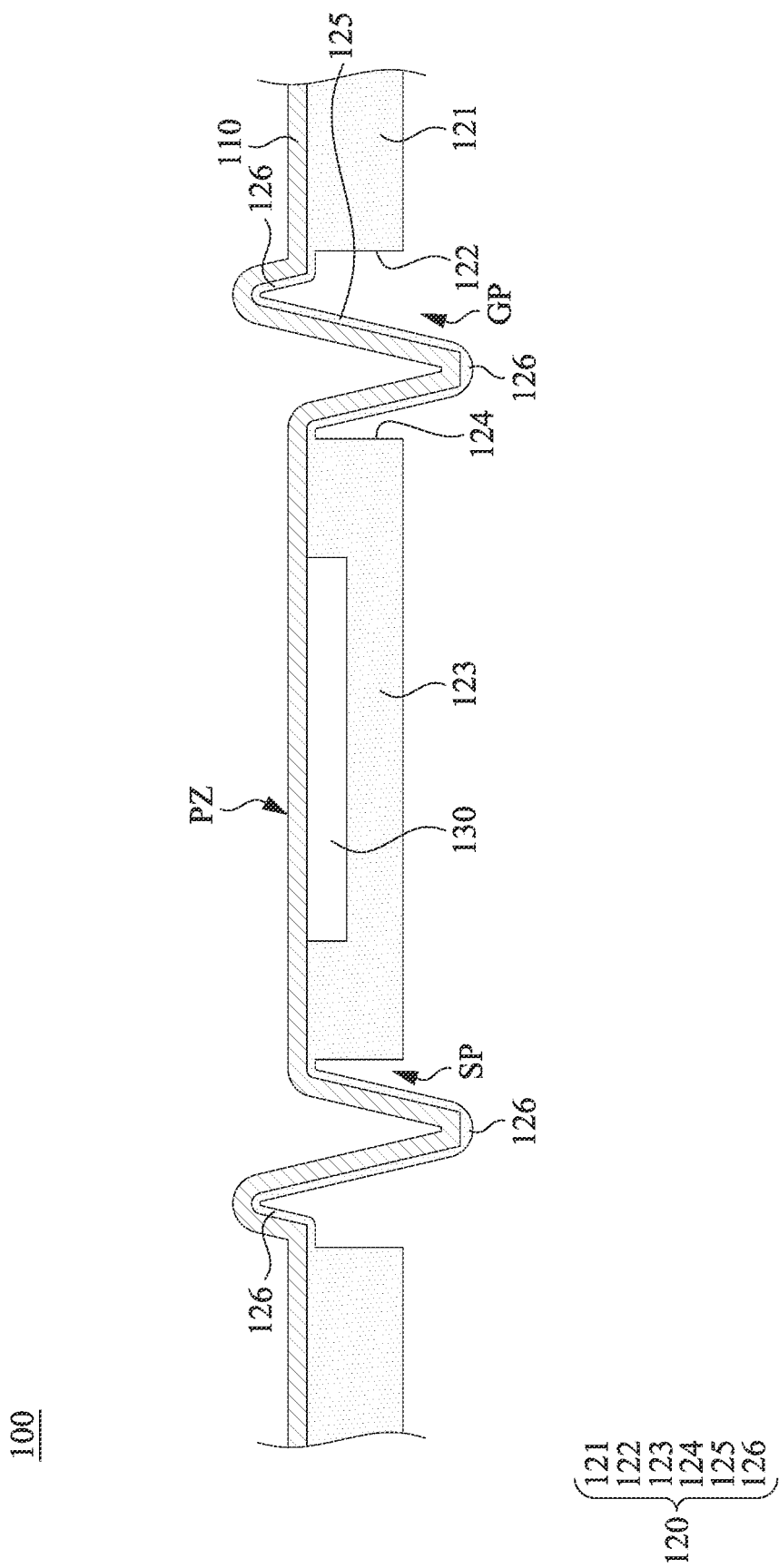
FIG. 6 is a cross-sectional view of a piezoelectric haptic structure according to another embodiment of the present disclosure.

Reference is made to FIGS. 5-6. FIG. 5 is a cross-sectional view of a piezoelectric haptic structure 100 according to a further embodiment of the present disclosure. FIG. 6 is a cross-sectional view of a piezoelectric haptic structure 100 according to another embodiment of the present disclosure. In this embodiment, as shown in FIGS. 5-6, according to different characteristics of the vibration of the vibrating portion 123 relative to the plate body 121, for example, for the sake of enhancement of a buffering effect of the vibration of the vibrating portion 123 and the thin film 110 relative to the plate body 121, the elastic portion 125 of the structural plate 120 has a plurality of curved parts 126 located between the outer wall 124 and the inner wall 122. Moreover, the length LG of the elastic portion 125 extending between the vibrating portion 123 and the plate body 121 is larger than the distance DT separated between the outer wall 124 and the inner wall 122. For example, as shown in FIG. 5, the elastic portion 125 has two curved parts 126 located between the outer wall 124 and the inner wall 122. The curved part 126 relatively near to the vibrating portion 123 protrudes towards a side of the thin film 110, while the curved part 126 relatively near to the plate body 121 protrudes towards a side away from the thin film 110. On the other hand, for example, as shown in FIG. 6, the elastic portion 125 also has two curved parts 126 located between the outer wall 124 and the inner wall 122. The curved part 126 relatively near to the vibrating portion 123 protrudes towards a side away from the thin film 110, while the curved part 126 relatively near to the plate body 121 protrudes towards a side of the thin film 110.

Figure 7:
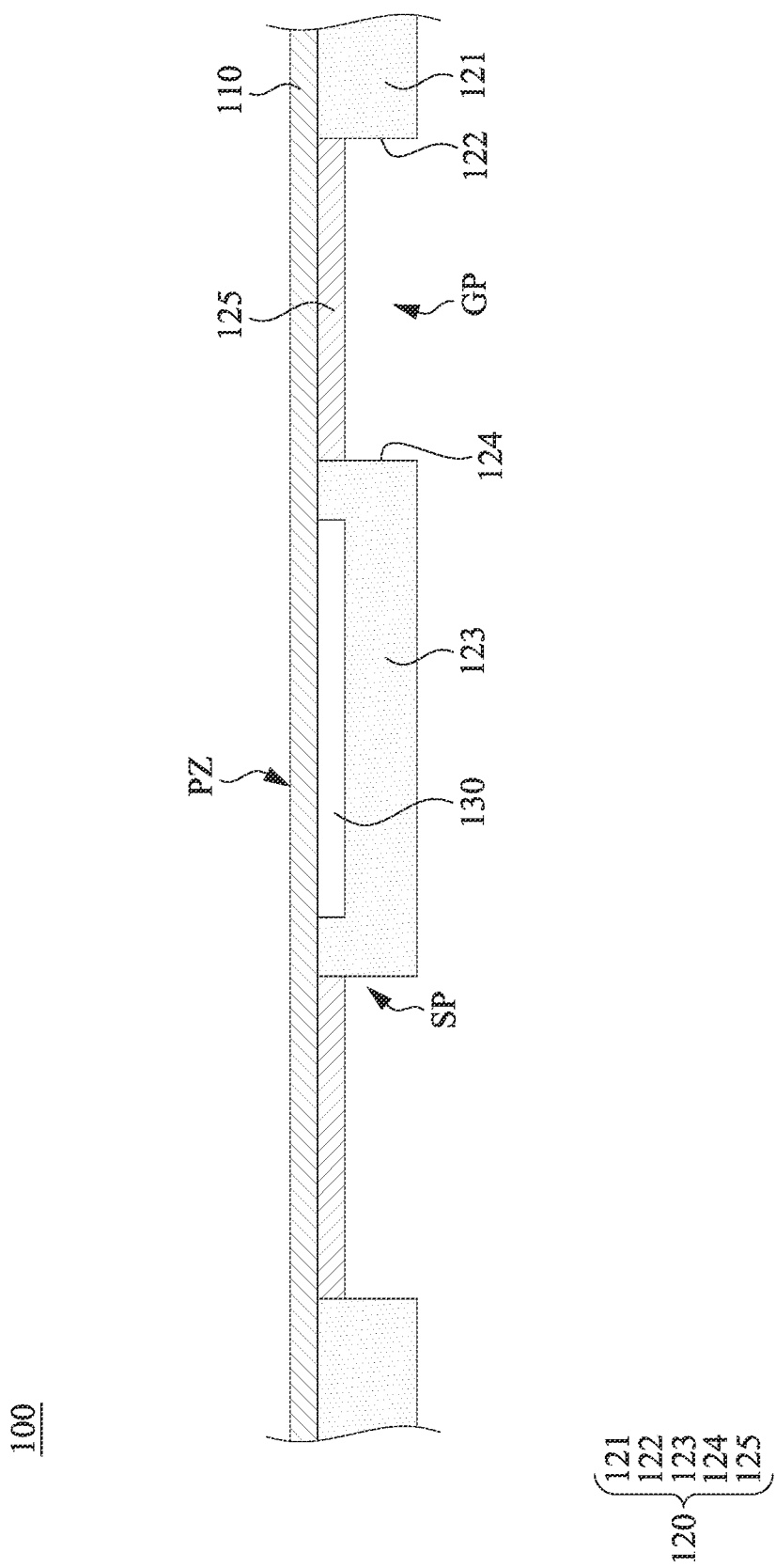
FIG. 7 is a cross-sectional view of a piezoelectric haptic structure according to a further embodiment of the present disclosure.

Reference is made to FIG. 7. FIG. 7 is a cross-sectional view of a piezoelectric haptic structure 100 according to a further embodiment of the present disclosure. For example, in this embodiment, as shown in FIG. 7, in order to enhance the buffering effect of vibration of the vibrating portion 123 and the thin film 110 relative to the plate body 121 and also reinforce the overall stiffness of the elastic portion 125 and the thin film 110, the elastic portion 125 of the structural plate 120 can be flexible plastic. This means the material of the elastic portion 125 is different from the material of the plate body 121 and the vibrating portion 123. In other words, according to the actual situations, the elastic portion 125 is not integrally formed with the vibrating portion 123 and the plate body 121.

Figure 8:
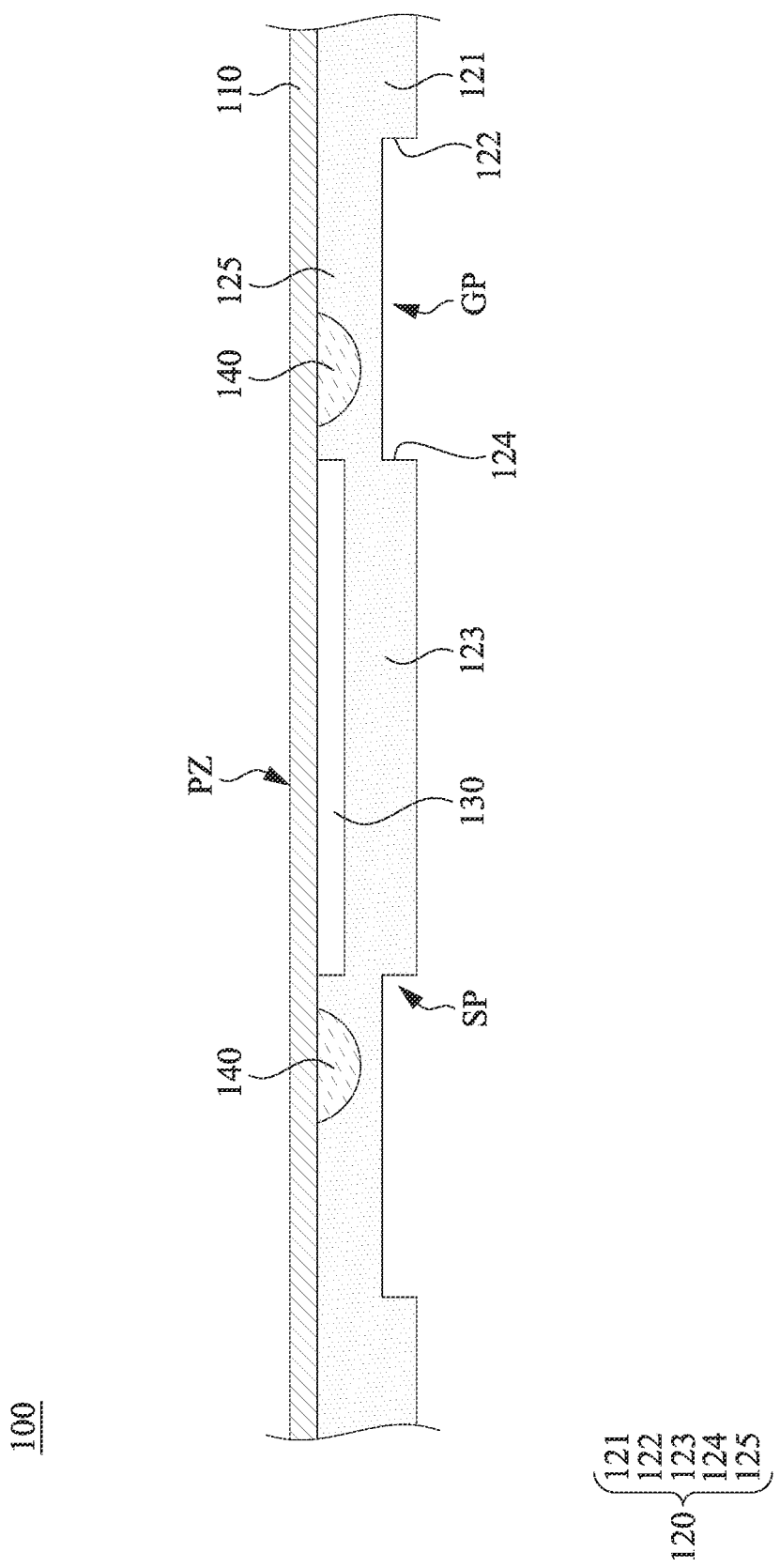
FIG. 8 is a cross-sectional view of a piezoelectric haptic structure according to another embodiment of the present disclosure.
Figure 9:
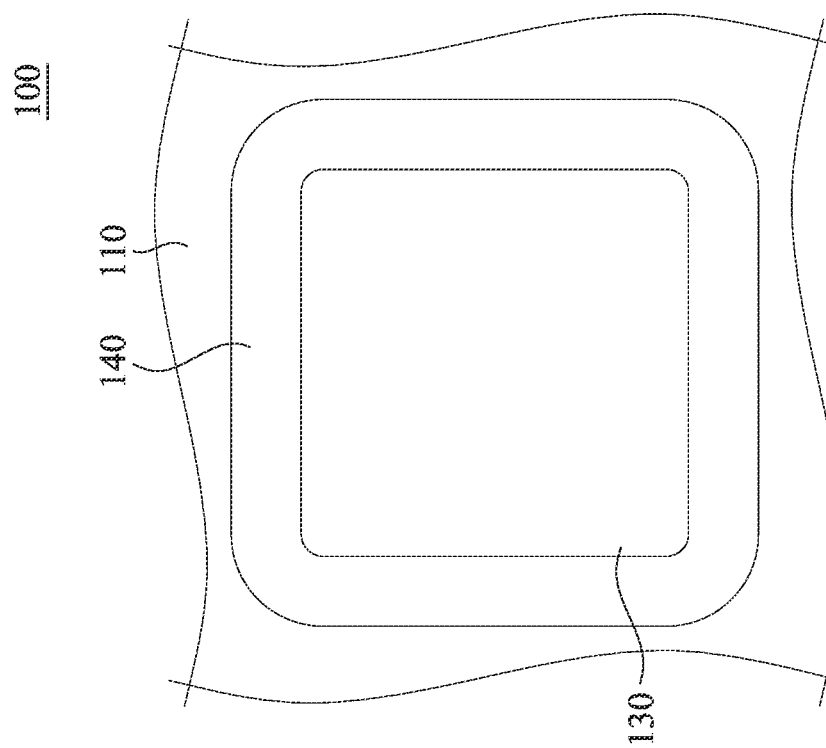
FIG. 9 is a bottom view of the piezoelectric haptic structure of FIG. 8, in which the structural plate is omitted.

Reference is made to FIGS. 8-9. FIG. 8 is a cross-sectional view of a piezoelectric haptic structure 100 according to another embodiment of the present disclosure. FIG. 9 is a bottom view of the piezoelectric haptic structure 100 of FIG. 8, in which the structural plate 120 is omitted. In this embodiment, as shown in FIGS. 8-9, in order to enhance the buffering effect of vibration of the vibrating portion 123 and the thin film 110 relative to the plate body 121, the piezoelectric haptic structure 100 further includes a plastic frame 140. The plastic frame 140 is disposed on a side of the thin film 110 facing to the elastic portion 125. The plastic frame 140 at least partially surrounds the piezoelectric actuator 130. For example, the plastic frame 140 is formed form soft glue. To be specific, in the manufacturing process of the piezoelectric haptic structure 100, after the piezoelectric actuator 130 and the plastic frame 140 are respectively disposed on the thin film 110, the structural plate 120 is disposed on the thin film 110 by injection molding, and the piezoelectric actuator 130 and the plastic frame 140 are respectively sandwiched between the thin film 110 and the structural plate 120, while the vibrating portion 123 and the elastic portion 125 respectively correspond to the piezoelectric actuator 130 and the plastic frame 140. In this embodiment, the plastic frame 140 and the piezoelectric actuator 130 are separated from each other. This means plastic frame 140 and the piezoelectric actuator 130 are not in contact with each other.

Figure 10:
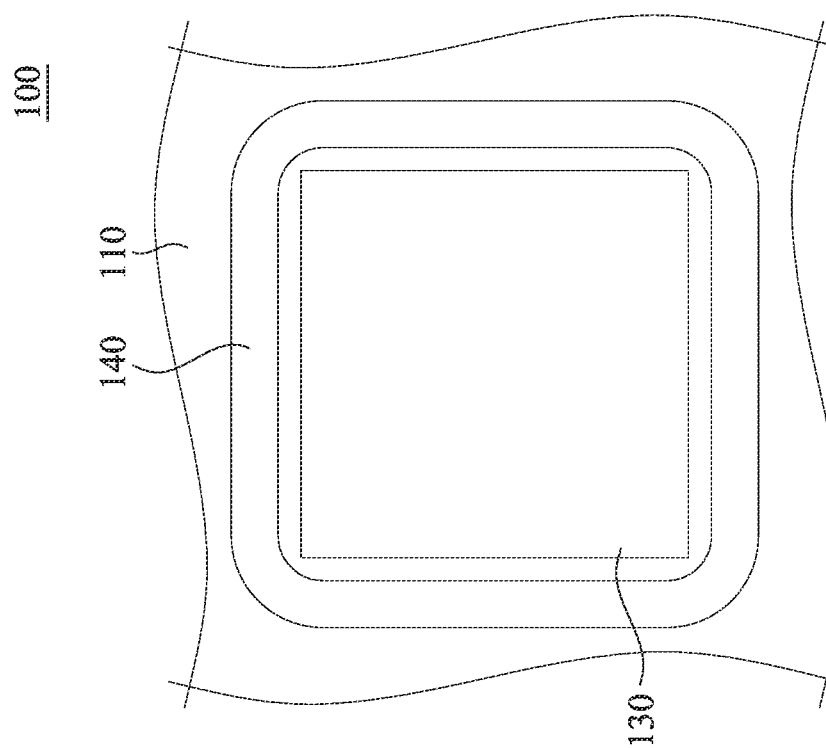
FIG. 10 is a bottom view of a piezoelectric haptic structure according to another embodiment of the present disclosure, in which the structural plate is omitted.

Reference is made to FIG. 10. FIG. 10 is a bottom view of a piezoelectric haptic structure 100 according to another embodiment of the present disclosure, in which the structural plate 120 is omitted. In this embodiment, as shown in FIG. 10, according to the actual situations, the plastic frame 140 surrounds and mutually connects with the piezoelectric actuator 130.

Figure 12:
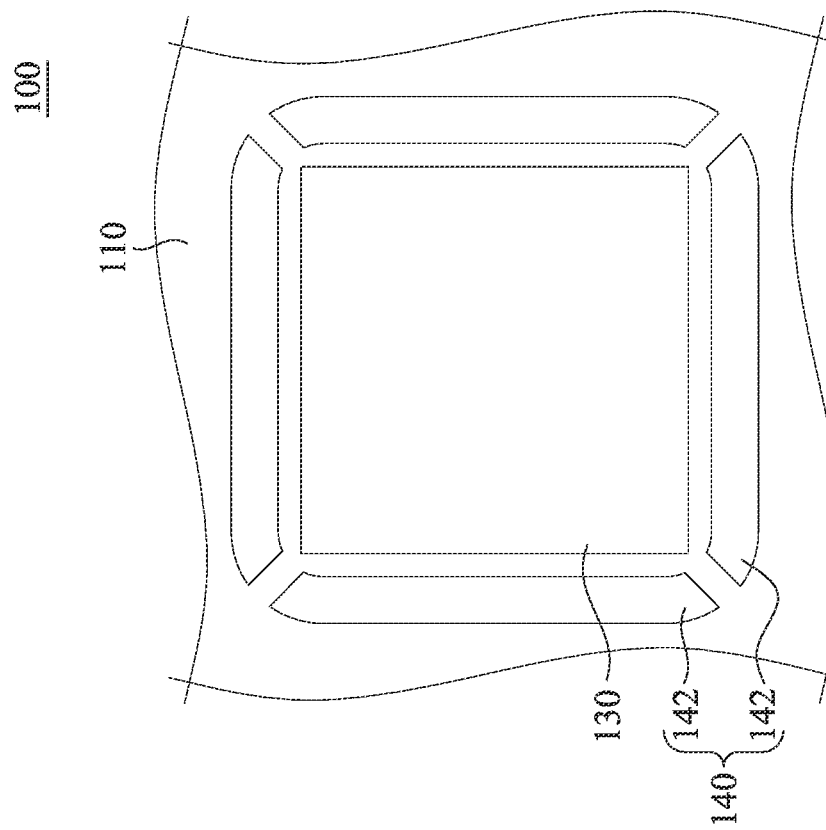
FIG. 12 is a bottom view of a piezoelectric haptic structure according to another embodiment of the present disclosure, in which the structural plate is omitted.
Figure 11:
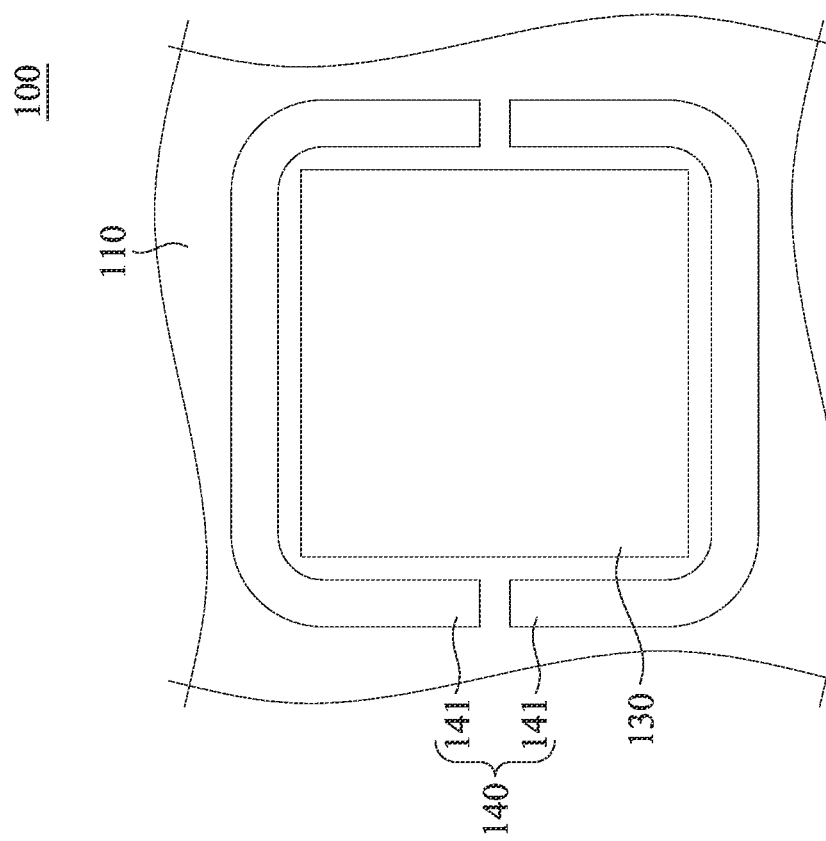
FIG. 11 is a bottom view of a piezoelectric haptic structure according to a further embodiment of the present disclosure, in which the structural plate is omitted.

Reference is made to FIGS. 11-12. FIG. 11 is a bottom view of a piezoelectric haptic structure 100 according to a further embodiment of the present disclosure, in which the structural plate 120 is omitted. FIG. 12 is a bottom view of a piezoelectric haptic structure 100 according to another embodiment of the present disclosure, in which the structural plate 120 is omitted. In this embodiment, as shown in FIGS. 11-12, the plastic frame 140 surrounds the piezoelectric actuator 130 and is separated from the piezoelectric actuator 130. This means the plastic frame 140 and the piezoelectric actuator 130 are not in contact with each other. For example, as shown in FIG. 11, the plastic frame 140 includes two C-shaped frames 141. The opening of each of the C-shaped frames 141 faces to each other. The C-shaped frames 141 are separated from each other and surround the piezoelectric actuator 130. On the other hand, for example, as shown in FIG. 12, the plastic frame 140 includes four rod-shaped frames 142. The rod-shaped frames 142 are separated from each other and surround the piezoelectric actuator 130 in the form of a rectangular arrangement.

In conclusion, the aforementioned embodiments of the present disclosure have at least the following advantages:

(1) Since the position of the vibrating portion corresponds to the pressing zone on the thin film, and the elastic portion is elastically connected between the outer wall of the vibrating portion and the inner wall of the plate body, when the piezoelectric actuator vibrates, the elastic portion carries out reciprocally elastic deformations with regard to the vibration of the piezoelectric actuator. Thus, the vibrating portion can significantly vibrate relative to the plate body, such that the user can clearly feel vibration of the vibrating portion together with the piezoelectric actuator and know that the pressing on the pressing zone is properly completed. In this way, the piezoelectric haptic structure can achieve a good effect of haptic feedback.

(2) Since the structure of the piezoelectric haptic structure is simple, and the quantity of the components involved is small, the manufacturing time and the production cost of the piezoelectric haptic structure can be effectively reduced.

(3) Since the elastic portion of the structural plate can have at least one curved part located between the outer wall and the inner wall, the buffering effect of the vibration of the vibrating portion and the thin film relative to the plate body is enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A piezoelectric haptic structure, comprising:
a thin film;
a structural plate, the thin film being stacked on the structural plate, the structural plate comprising:
   a plate body having in inner wall defining a space;
   a vibrating portion located in the space and being away from the inner wall, the vibrating portion having an outer wall, the outer wall and the inner wall defining a gap therebetween; and
   an elastic portion elastically connected between the outer wall and the inner wall, the elastic portion sealing the gap and abutting against the thin film; and
a piezoelectric actuator sandwiched between the thin film and the vibrating portion,
wherein the vibrating portion has a first surface and a second surface opposite to the first surface, the first surface directly connects with the thin film, the second surface is away from the thin film, a vertical projection of the second surface to the thin film at least partially overlaps with the first surface, the first surface and the second surface define a first thickness therebetween, the plate body has a third surface and a fourth surface opposite to the third surface, the third surface directly connects with the thin film, the fourth surface is away from the thin film, the third surface and the fourth surface define a second thickness therebetween, the elastic portion has a fifth surface and a sixth surface opposite to the fifth surface, the fifth surface directly connects with the thin film and is connected between the first surface and the third surface, the sixth surface is away from the thin film, the fifth surface and the sixth surface define a third thickness therebetween, the third thickness is less than the first thickness and less than second thickness.

2. The piezoelectric haptic structure of claim 1, wherein the elastic portion completely surrounds the vibrating portion.

3. The piezoelectric haptic structure of claim 1, wherein the outer wall and the inner wall are separated from each other by at least one distance, the elastic portion has a length extending between the outer wall and the inner wall, the length is equal to the distance.

4. The piezoelectric haptic structure of claim 1, wherein a first material of the elastic portion is same as a second material of the plate body and the vibrating portion.

* * * * *